United States Patent [19]

Kamiya

[11] Patent Number: 5,942,701
[45] Date of Patent: Aug. 24, 1999

[54] TEST PROBE FOR A MEASURING INSTRUMENT AND TESTER INCORPORATING THE TEST PROBE

[75] Inventor: Manabu Kamiya, Nagano, Japan

[73] Assignee: Seiko Epson Corporation, Tokyo, Japan

[21] Appl. No.: 09/021,808

[22] Filed: Feb. 11, 1998

[30] Foreign Application Priority Data

Feb. 25, 1997 [JP] Japan ................................. 9-057035

[51] Int. Cl.⁶ .................................................. G01D 21/00
[52] U.S. Cl. ...................... 73/866.5; 324/72.5; 324/754; 439/482
[58] Field of Search ............................. 73/866.5, 866.3; 324/72.5, 115, 157, 556, 754, 761; 439/482

[56] References Cited

U.S. PATENT DOCUMENTS

| | | | |
|---|---|---|---|
| 5,041,781 | 8/1991 | Kawada et al. | 324/158 |
| 5,084,673 | 1/1992 | Kamaza | 324/158 |
| 5,235,268 | 8/1993 | Harthcock | 324/115 |
| 5,414,346 | 5/1995 | Mohan | 324/72.5 |
| 5,448,162 | 9/1995 | Beha | 324/72.5 |

*Primary Examiner*—Hezron Williams
*Assistant Examiner*—Thuy Vinh Tran
*Attorney, Agent, or Firm*—Oliff & Berridge, PLC

[57] ABSTRACT

There are provided a test probe for a measuring instrument, and a tester incorporating the test probe. The test probe includes a probe, a lead wire, a grip and a lead wire-holding piece. A probe for being brought into contact with a measuring object has a proximal end. A lead wire has one end thereof connected to a main unit of the measuring instrument and the other end thereof connected to the probe. A grip protects a portion connecting the probe and the lead wire. The grip is engaged with the proximal end of the probe. A lead wire-holding piece fixedly holds a distal end of the covered portion of the lead. The grip has a retaining portion engaged with the lead wire-holding piece for preventing the lead wire from being drawn out from the grip. In another form, the test probe has a crimp contact for connecting the proximal end of the probe and an uncovered portion of the lead wire. The grip protects a portion connecting the probe and the lead wire, including the crimp contact. The grip is fixedly engaged with the proximal end of the probe.

10 Claims, 5 Drawing Sheets

TEST PROBE FOR A MEASURING INSTRUMENT AND TESTER INCORPORATING THE TEST PROBE

BACKGROUND OF THE INVENTION

1. Field of the Invention

This invention relates to a test probe for a measuring instrument, such as a tester (circuit tester), and a tester incorporating the test probe.

2. Prior Art

In a measuring instrument, such as a tester which has a possibility of measuring high voltages, to prevent failure of the instrument due to a disconnection or the like and for safety purposes, it is required to prevent a mechanical force from being applied to electrically-connecting portions. To this end, in a conventional tester, the inside of a grip and covering of a lead wire are bonded to each other to prevent a mechanical force from being applied to a portion where a probe and the lead wire are soldered to each other (connecting portion) when the lead wire is pulled.

FIG. 1 shows a test probe of the conventional tester constructed as described above. In this test probe 51, a core wire 53a of a lead wire 53 is soldered to a proximal end of a probe 52, while a grip 54 having the proximal end of the probe 52 screwed to a distal end thereof and a covering 53b of the lead wire 53 are stuck to each other by an adhesive 55. As a result, even if a force for drawing the lead wire 53 out of the grip 54 is applied, the force acts on the grip 54 but does not act on the soldered portion 56.

In the conventional test probe 51 thus constructed, although a mechanical force is not applied to an electrically-connecting portion, the grip 54 and the lead wire 53 are stuck to each other, so that, when any of the component parts of the grip 54, the probe 52, the lead wire 53 and the like is broken, it is impossible to replace only the broken component part. Further, when the soldered portion 56 suffers from connection failure, it is impossible to repair the same.

Furthermore, since the probe 52 and the lead wire 53 are connected to each other by soldering, the connection operation is required to be manually carried out. This requires skills and increases manufacturing costs of the test probe, while relatively degrading the reliability of the connecting portion.

SUMMARY OF THE INVENTION

It is a first object of the invention to provide a test probe for a measuring instrument, which is capable of preventing a mechanical force from being applied to a portion electrically connecting a probe and a lead wire, while enabling component parts thereof to be replaced or maintained.

It is a second object of the invention to provide a test probe for a measuring instrument, which is capable of improving the reliability of a portion connecting a probe and a lead wire.

It is a third object of the invention to provide a tester incorporating a test probe which is capable of preventing a mechanical force from being applied to a portion electrically connecting a probe and a lead wire, while enabling component parts thereof to be replaced and maintained, and at the same time improving the reliability of the portion connecting the probe and the lead wire.

To attain the first object, according to a first aspect of the invention, there is provided a test probe for a measuring instrument including a main unit and used for carrying out a measurement on a measuring object, comprising:

a probe for being brought into contact with the measuring object, the probe having a proximal end;

a lead wire having one end thereof connected to the main unit of the measuring instrument and another end thereof connected to the probe, the lead wire having a covered portion;

a grip for protecting a portion connecting the probe and the lead wire, the grip being fixedly engaged with the proximal end of the probe; and a lead wire-holding piece for fixedly holding a distal end of the covered portion of the lead wire, the grip having a retaining portion fixedly engaged with the lead wire-holding piece for preventing the lead wire from being drawn out from the grip.

According to this test probe, the lead wire-holding piece fixedly holds the distal end of the covered portion of the lead wire, while the grip is formed with the retaining portion which is fixedly engaged with the lead wire-holding piece for preventing the lead wire from being drawn out from the grip. Therefore, when a force for drawing out the lead wire from the grip is applied to the lead wire, the lead wire-holding piece abuts against the retaining portion of the grip, and the drawing force acts on the grip. This prevents the drawing force from acting on the portion connecting the probe and the lead wire (electrically connecting portion). On the other hand, by disengaging the proximal end of the probe and the grip from each other, the grip can be disconnected from the probe, and the portion connecting the probe and the lead wire can be exposed.

Preferably, the lead wire has an uncovered portion, the test probe including a crimp contact for connecting the proximal end of the probe and the uncovered portion of the lead wire, the lead wire-holding piece being integrally formed on the crimp contact.

According to this preferred embodiment, since the probe and the lead wire are connected to each other via the crimp contact, the connection can be effected by a mechanical operation, whereby the electrical and mechanical connections of the probe and the lead wire can be made homogeneous and stable. Further, since the lead wire-holding piece is integrally formed on the crimp contact, it is possible to firmly and simultaneously attach the crimp contact and the lead wire-holding piece to the lead wire, and at the same time reduce the number of component parts of the test probe.

More preferably, the proximal end of the probe is fitted in the crimp contact by a slip-in method.

According to this preferred embodiment, the probe can be fitted in the crimp contact by a slip-in method, which makes it possible to replace the probe easily. Further, if the lead wire-holding piece and the retaining portion of the grip are not accurately positioned with respect to each other, the inaccuracy of positional relationship therebetween can be accommodated by a slight shift of the probe inserted into the crimp contact. The slip-in method can be applied by forming one of the crimp contact and the probe as a male type and the other as a female type.

Further preferably, the proximal end of the probe has a contact pin integrally formed thereon, the crimp contact having a probe-fitting portion in the form of a hollow cylinder having a weak resilience for permitting the contact pin to be inserted therein.

More preferably, the lead wire-holding piece encloses the distal end of the covered portion of the lead wire and is crimped thereon for fixedly holding the distal end of the covered portion of the lead wire.

To attain the second object, according to a second aspect of the invention, there is provided a test probe for a measuring instrument including a main unit and used for carrying out a measurement on a measuring object, comprising:

a probe for being brought into contact with the measuring object, the probe having a proximal end;

a lead wire having one end thereof connected to the main unit of the measuring instrument and another end thereof connected to the probe, the lead wire having an uncovered portion;

a crimp contact for connecting the proximal end of the probe and the uncovered portion of the lead wire; and a grip for protecting a portion connecting the probe and the lead wire, the portion including the crimp contact, the grip being fixedly engaged with the proximal end of the probe.

According to this test probe, since the probe and the lead wire are connected to each other by the crimp contact, the connection between the probe and the lead wire can be performed by a mechanical operation without necessitating a conventional manual soldering operation. This makes it possible to make the electrical and mechanical connections of the components of the test probe homogeneous, and reduce costs of manufacturing operations.

Preferably, the crimp contact includes a probe-fitting portion in which the proximal end of the probe is fitted, and a lead wire-connecting portion for crimping the uncovered portion and a distal end of a covered portion of the lead wire in the vicinity of the uncovered portion of the lead wire, the proximal end of the probe being fitted in the probe-fitting portion by a slip-in method.

According to this preferred embodiment, not only the uncovered portion of the lead wire but also the covered portion thereof are crimped by the lead wire-connecting portion, whereby the connection between the proximal end of the probe and the uncovered portion of the lead wire is reinforced. Further, the probe can be fitted in the probe-fitting portion of the crimp contact by a slip-in method, which enables probes to be easily exchanged.

More preferably, the proximal end of the probe has a contact pin integrally formed thereon, the probe-fitting portion of the crimp contact being in the form of a hollow cylinder and having a weak resilience for permitting the contact pin to be inserted therein.

To attain the third object, according to a third aspect of the invention, there is provided a tester incorporating the test probe according to the first aspect of the invention.

According to this tester, disconnection and faulty connection of the wire can be prevented, and the test probe can be constructed to be easily maintainable.

To attain the third object, according to a fourth aspect of the invention, there is provided a tester incorporating the test probe according to the second aspect of the invention.

According to this tester, the same advantageous effects as obtained by the third aspect of the invention can be obtained.

The above and other objects, features, and advantages of the invention will become more apparent from the following detailed description taken in conjunction with the accompanying drawings.

DETAILED DESCRIPTION

The invention will now be described in detail with reference to drawings showing embodiments thereof.

Figure 1:
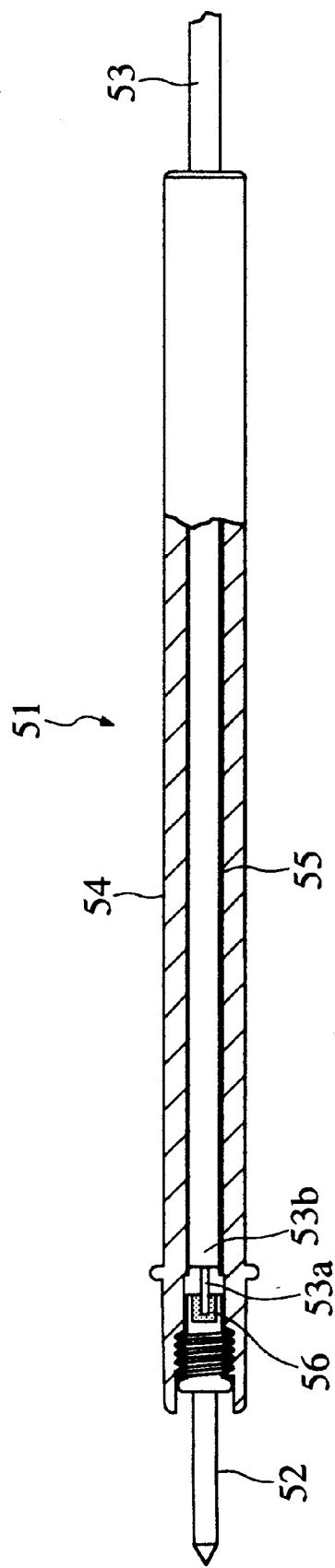
FIG. 1 is a cross-sectional view of a test probe of a conventional tester.
Figure 2:
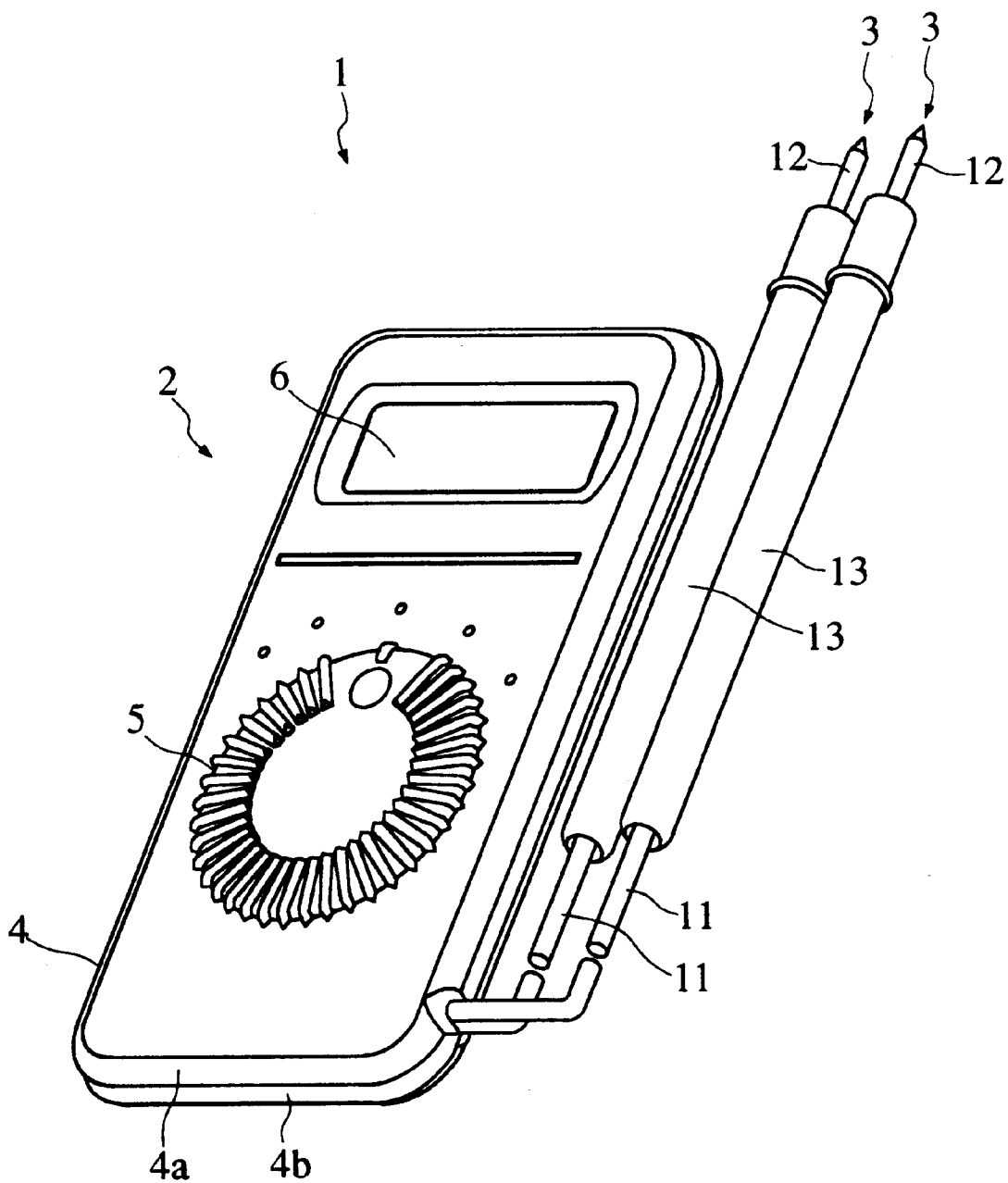
FIG. 2 is a perspective view of an appearance of a tester incorporating a test probe according to an embodiment of the invention.

Referring first to FIG. 2, there is shown a tester (circuit tester) incorporating a pair of test probes for a measuring instrument, according to an embodiment of the invention. The tester is of a digital type which displays results of measurements in numerical values, and FIG. 2 is a perspective view of an appearance of the same. As shown in the figure, the tester 1 is comprised of a main unit 2 and a pair of plus and minus test probes 3, 3 connected to the main unit.

The main unit 2 is comprised of a body casing 4 formed by an upper casing 4a and a lower casing 4b, which accommodates component parts including a circuit board, not shown. At an approximately central portion of the top of the upper casing 4a, there is arranged a rotary switch 5 for switching measuring modes and at a location above the rotary switch 5 as viewed in the figure, there is arranged a display 6 for digitally displaying measured values. The rotary switch 5 is provided for switching between measuring modes of the tester 1. In the present embodiment, in a clockwise order starting from the OFF position disposed at an extremity of counterclockwise turn of the rotary switch, there are arranged switching positions for a direct current mode, an alternating current mode, an ohm mode and a conduction mode, respectively.

The user turns the rotary switch 5 to set the same to a desired measuring mode and carries out a zero point correction. Then, he brings a pair of test probes 3, 3 into contact with a measuring object for measurement.

Each test probe 3 is comprised of a lead wire 11 connected to the main unit 2, a probe 12 connected to a distal end of the lead wire 11, and a grip 13 in the form of a hollow cylinder which supports the probe 12 and at the same covers a portion connecting the probe 12 and the lead wire 11. Further, the distal end of the lead wire 11 and the probe 12 are connected by a crimp contact 14 (see FIG. 3). The user holds the grips 13 of the test probes 3 by his hands, respectively, in such a manner as holding pencils and bring the tips of the probes 12 into contact with the measuring object.

Figure 3:
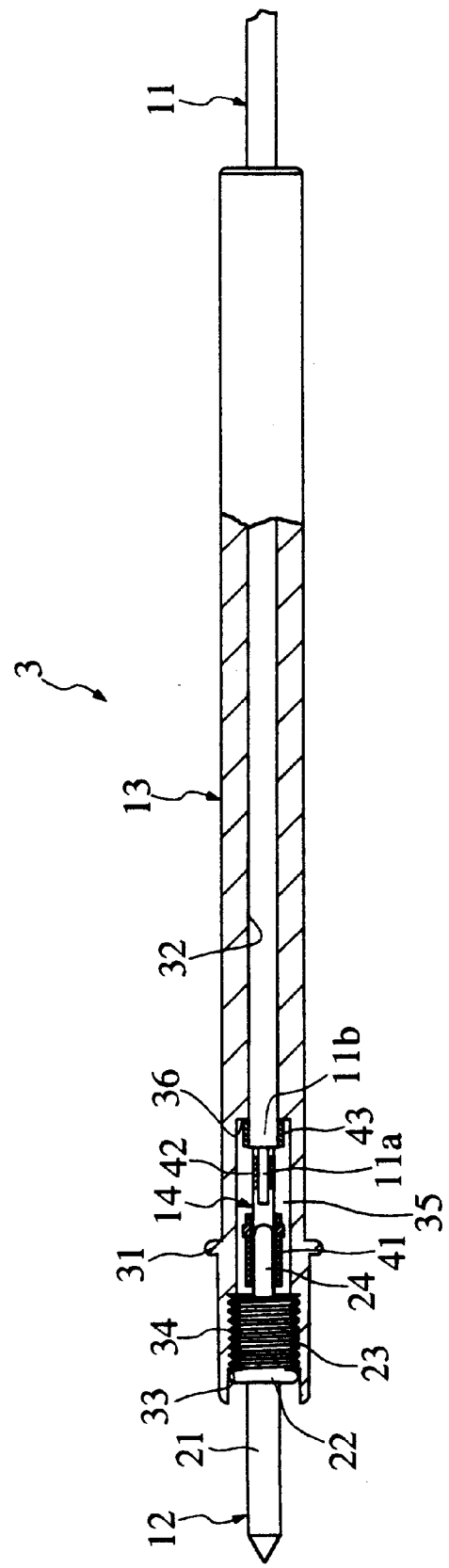
FIG. 3 is a cross-sectional view of the test probe according to the embodiment.

Referring to FIG. 3, each of the probes 12 is comprised of a probe body 21 having a sharply pointed tip, a collar 22 continuous with the probe body 21, an externally-threaded portion 23 continuous with the collar 22, and a contact pin 24 joined to the externally-threaded portion 23. The probe 12 is screwed into the grip 13 to a position at which the collar 22 thereof abuts against a stepped portion of an inner wall of the distal end of the grip 13, whereby the probe 12 is rigidly screwed into the distal end of the grip 13 with only the probe body 21 being exposed from the distal end of the grip 13.

The grip 13 has a generally hollow cylindrical shape, and is formed with a non-slip annular projection 31 on an outer peripheral surface thereof at a location close to its distal end. An inner peripheral surface of the grip 13 except a distal end portion thereof defines a guide portion (space) 32 through which the lead wire 11 extends. The guide portion (space) 32 has a slightly larger diameter than that of the lead wire 11. The distal end of the grip 13 has an inner surface thereof formed with the stepped portion 33 for receiving the collar 22, and an internally-threaded portion 34 continuous with the stepped portion 33, into which the externally-threaded portion 23 is screwed. Axially inward of the internally-threaded portion 34, there is formed an accommodating space 35 for accommodating the crimp contact 14, and at a boundary between the accommodating space 35 and the guide portion 32 having a smaller diameter than that of the accommodating space 35, there is formed a retaining portion 36 for receiving a lead wire-holding piece 43, described hereinafter, of the crimp contact 14.

Figure 4:
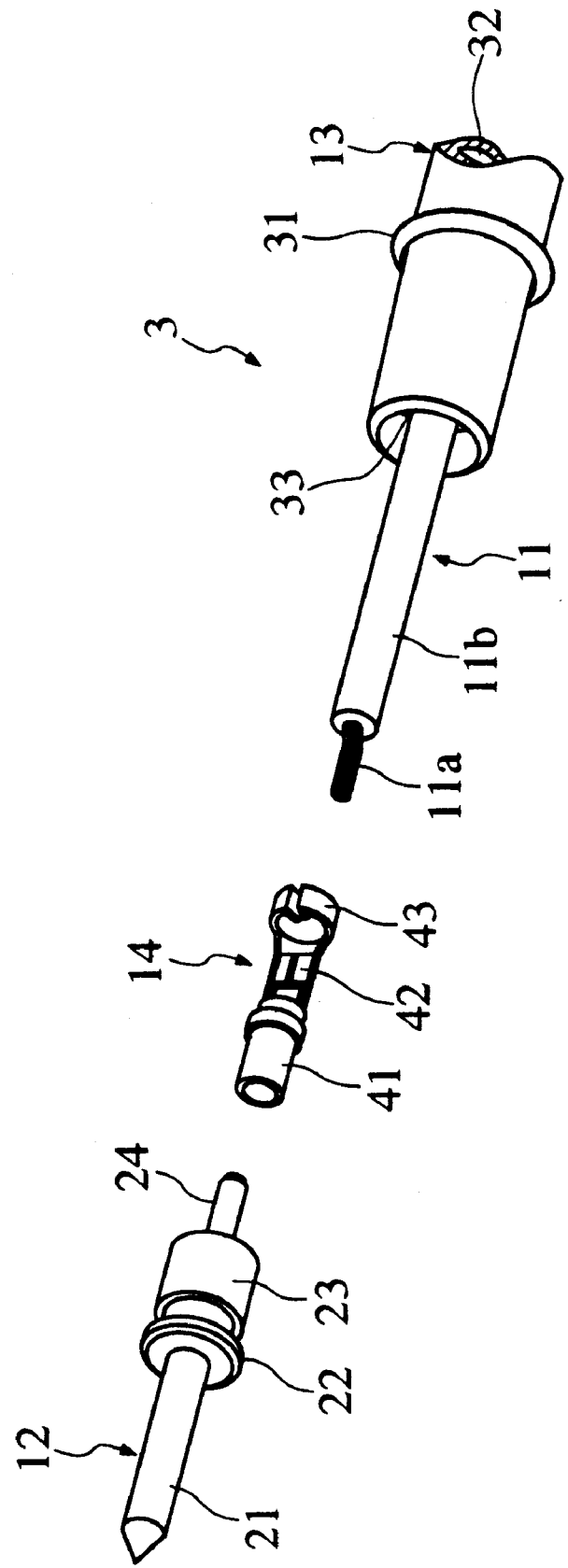
FIG. 4 is an exploded perspective view of a crimp contact and component parts associated therewith of the test probe according to the embodiment.
Figure 5:
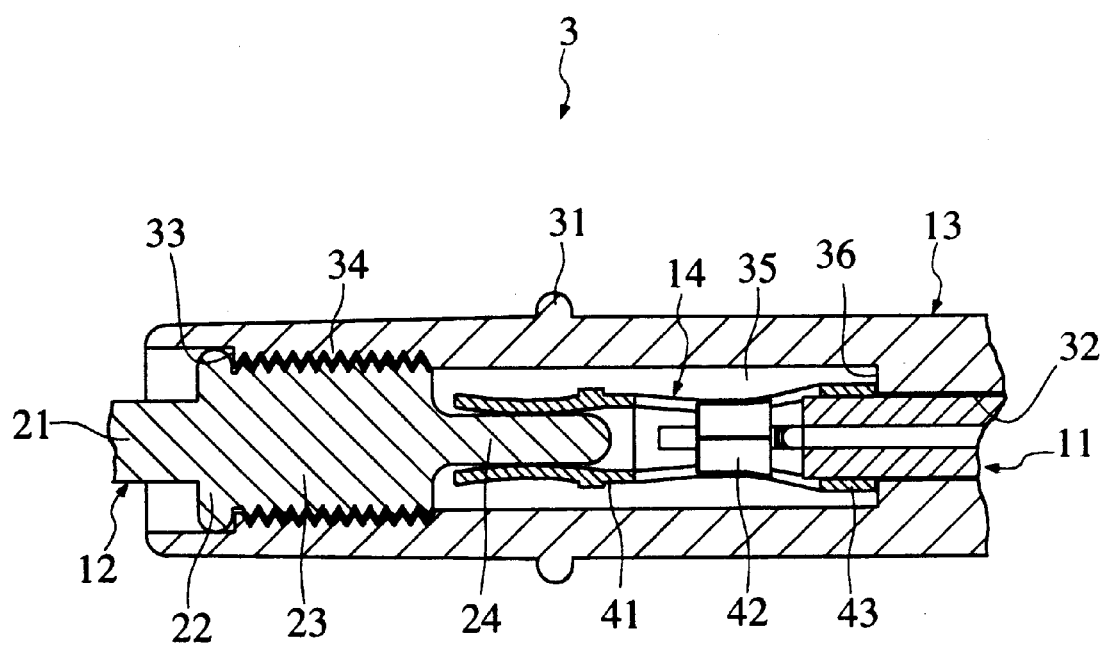
FIG. 5 is an enlarged sectional view of the crimp contact and component parts associated therewith of the test probe according to the embodiment.

The crimp contact 14 is comprised of, as shown in FIGS. 4 and 5, a probe-fitting portion 41 in which the contact pin 24 of the probe 12 is removably fitted, a core wire-connecting portion 42 for fixedly holding an exposed core wire 11a (uncovered portion) of the lead wire 11, and the lead wire-holding piece (covering-holding portion) 43 for fixedly holding a covered portion 11b of the lead wire 11 at a location close to the exposed core wire 11a, all formed into an unitary member. The probe-fitting portion 41 is formed by bending an end of a frame as a material of the crimp contact 14 from opposite lateral sides into a shape circular in cross section, and has a weak resilience for permitting the contact pin 24 of the probe to be inserted therein. That is, the probe 12 is fitted in the crimp contact 14 in a slip-in manner with the contact pin 24 as a male portion and the probe-fitting portion 41 as a female portion. It should be noted that the probe 12 may be fitted in the crimp contact 14 in a slip-on manner with the contact pin 24 as a female portion and the probe-fitting portion 41 as a male portion.

Similarly to the probe-fitting portion 41, the core wire-connecting portion 42 is formed by bending part of the frame of the crimp contact 14 from opposite lateral sides so as to enclose the exposed core wire 11a therein and swaging the enclosed exposed core wire 11a for fixedly retaining the same. Further, the lead wire-holding piece 43 is formed, similarly to the core wire-connecting portion 42, by bending the other end of the frame of the crimp contact 14 from opposite lateral sides so as to enclose a portion of the covered portion 11b therein and swaging the enclosed portion for fixedly retaining the same. The lead wire-holding piece 43 is positioned such that, when the grip 13 is fully screwed onto the probe 12 fitted in the crimp contact 14, an end of the lead wire-holding piece 43 is brought into substantial contact with the retaining 36 of the grip 13. The proximal end of the lead wire-holding piece 43 may be formed with cuts to provide arrow-headed portions for biting the covered portion 11b, thereby reinforcing a retaining force of the lead wire-holding piece 43 for preventing the lead wire 11 from being removed from the grip 13.

According to this arrangement, the exposed core wire 11a of the lead wire 11 and the covered portion 11b of the same are fixedly held in the crimp contact 14 and at the same time the contact pin 24 of the probe 12 is fitted in the same. Therefore, the lead wire 11 and the probe 12 can be connected to each other without soldering and automatically by using a dedicated device. This establishes a stable electrical connection between the lead wire 11 and the probe 12, which makes it possible to prevent not only connection failure but also variations in connection resistance between individual products. Therefore, it is possible to enhance the reliability of the test probe 3 and hence that of the tester 1.

Further, after the lead wire 11 and the probe 12 are connected to each other by the crimp contact 14, when the probe 12 is screwed into the grip 13 for assemblage, the lead wire-holding piece 43 of the crimp contact 14 abuts against the retaining portion 36 of the grip 13, whereby the lead wire 11 is in a state retained in the grip 13 by the lead wire-holding piece 43. That is, the electrical connection between the lead wire 11 and the probe 12 is established by the crimp contact 14, while mechanical connections of the lead wire 11, the probe 12 and the grip 13 are effected by the cooperation of the lead wire-holding piece 43 of the crimp contact 14 and the retaining portion 36 of the grip 13. As a result, when a force for drawing the lead wire 11 out of the grip 13 is applied to the lead wire 11, the force is applied to the grip 13 but not applied to a portion connecting the crimp contact 14 and the exposed core wire 11a, or a portion connecting the crimp contact 14 and the probe 12, which prevents the lead wire 11 from being drawn out of the grip 13, thereby improving the reliability of the test probe 3 and hence that of the tester 1.

It should be noted that in the crimp contact, only the lead wire-holding piece may be formed as a separate member. In such a case, the lead wire-holding piece is made of a resin or the like, and after positioning, it is bonded to the covered portion of the lead wire.

As described above, according to the present embodiment, the lead wire is engaged with the grip in a state retained therein, so that a force for drawing out the lead wire does not act on a portion connecting between the probe and the lead wire. This makes it possible to prevent a mechanical force from being applied to a portion electrically connecting between the probe and the lead wire. Further, by disengaging the probe from the grip, it is possible to expose a portion connecting the probe and the lead wire, which enables component parts to be replaced or maintained without any inconveniences.

Furthermore, according to the present embodiment, connection between a probe and a lead wire can be established using a crimp contact through a mechanical operation, so that it is possible to carry out the connecting operation easily, increasing the reliability of a portion electrically connecting the probe and the lead wire, which makes it possible to enhance the reliability of a tester incorporating such probes for a measuring instrument.

It is further understood by those skilled in the art that the foregoing are preferred embodiments of the invention, and that various changes and modification may be made without departing from the spirit and scope thereof.

What is claimed is:

1. A test probe for a measuring instrument including a main unit and used for carrying out a measurement on a measuring object, comprising:

a probe for being brought into contact with said measuring object, said probe having a proximal end;

a lead wire having one end thereof connected to said main unit of said measuring instrument and another end thereof connected to said probe, said lead wire having a covered portion;

a grip for protecting a portion connecting said probe and said lead wire, said grip being fixedly engaged with said proximal end of said probe; and a lead wire-holding piece for fixedly holding a distal end of said covered portion of said lead wire, said grip having a retaining portion fixedly engaged with said lead wire-holding piece for preventing said lead wire from being drawn out from said grip.

2. A test probe according to claim 1, wherein said lead wire has an uncovered portion, said test probe including a crimp contact for connecting said proximal end of said probe and said uncovered portion of said lead wire, said lead wire-holding piece being integrally formed on said crimp contact.

3. A test probe according to claim 2, wherein said proximal end of said probe is fitted in said crimp contact by a slip-in method.

4. A test probe according to claim 3, wherein said proximal end of said probe has a contact pin integrally formed thereon, said crimp contact having a probe-fitting portion in the form of a hollow cylinder having a weak resilience for permitting said contact pin to be inserted therein.

5. A test probe according to claim 2, wherein said lead wire-holding piece encloses said distal end of said covered portion of said lead wire and is crimped thereon for fixedly holding said distal end of said covered portion of said lead wire.

6. A test probe for a measuring instrument including a main unit an used for carrying out a measurement on a measuring object, comprising:

a probe for being brought into contact with said measuring object, said probe having a proximal end;

a lead wire having one end thereof connected to said main unit of said measuring instrument and another end thereof connected to said probe, said lead wire having an uncovered portion;

a crimp contact for connecting said proximal end of said probe and said uncovered portion of said lead wire; and a grip for protecting a portion connecting said probe and said lead wire, said portion including said crimp contact, said grip being fixedly engaged with said proximal end of said probe.

7. A test probe according to claim 6, wherein said crimp contact includes a probe-fitting portion in which said proximal end of said probe is fitted, and a lead wire-connecting portion for crimping said uncovered portion and a distal end of a covered portion of said lead wire in the vicinity of said uncovered portion of said lead wire, said proximal end of said probe being fitted in said probe-fitting portion by a slip-in method.

8. A test probe according to claim 7, wherein said proximal end of said probe has a contact pin integrally formed thereon, said probe-fitting portion of said crimp contact being in the form of a hollow cylinder and having a weak resilience for permitting said contact pin to be inserted therein.

9. A tester for carrying out a measurement on a measuring object, said tester including a main unit, and a test probe, said test probe comprising:

a probe for being brought into contact with said measuring object, said probe having a proximal end;

a lead wire having one end thereof connected to said main unit of said measuring instrument and another end thereof connected to said probe, said lead wire having a covered portion;

a grip for protecting a portion connecting said probe and said lead wire, said grip being fixedly engaged with said proximal end of said probe; and a lead wire-holding piece for fixedly holding a distal end of said covered portion of said lead wire, said grip having a retaining portion fixedly engaged with said lead wire-holding piece for preventing said lead wire from being drawn out from said grip.

10. A tester for carrying out a measurement on a measuring object, said tester including a main unit, and a test probe, said test probe comprising:

a probe for being brought into contact with said measuring object, said probe having a proximal end;

a lead wire having one end thereof connected to said main unit of said measuring instrument and another end thereof connected to said probe, said lead wire having an uncovered portion;

a crimp contact for connecting said proximal end of said probe and said uncovered portion of said lead wire; and a grip for protecting a portion connecting said probe and said lead wire, said portion including said crimp contact, said grip being fixedly engaged with said proximal end of said probe.

* * * * *